(12) United States Patent
Tsai et al.

(10) Patent No.: US 9,209,302 B2
(45) Date of Patent: Dec. 8, 2015

(54) METHOD OF REDUCING THE HEIGHTS OF SOURCE-DRAIN SIDEWALL SPACERS OF FINFETS THROUGH ETCHING

(71) Applicant: Taiwan Semiconductor Manufacturing Company, Ltd., Hsin-Chu (TW)

(72) Inventors: Tsung-Che Tsai, Hsinchu (TW); Yi-Feng Chang, Xinbei (TW); Jam-Wem Lee, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/090,763

(22) Filed: Nov. 26, 2013

(65) Prior Publication Data
US 2014/0264604 A1 Sep. 18, 2014

Related U.S. Application Data

(60) Provisional application No. 61/780,647, filed on Mar. 13, 2013.

(51) Int. Cl.
*H01L 21/3205* (2006.01)
*H01L 29/78* (2006.01)
*H01L 29/66* (2006.01)

(52) U.S. Cl.
CPC ........ *H01L 29/785* (2013.01); *H01L 29/66795* (2013.01); *H01L 29/7853* (2013.01)

(58) Field of Classification Search
CPC ............ H01L 29/785; H01L 29/66795; H01L 29/7851; H01L 21/0217; H01L 21/0228; H01L 21/266; H01L 21/324; H01L 21/31055; H01L 21/26586
USPC ......... 438/149, 151, 154, 294, 283, 424, 595, 438/705; 257/347, 351, 288, 368, 401
See application file for complete search history.

(56) References Cited

U.S. PATENT DOCUMENTS

2011/0101455 A1* 5/2011 Basker .............. H01L 21/26586 257/347

* cited by examiner

*Primary Examiner* — Dung Le
(74) *Attorney, Agent, or Firm* — Slater & Matsil, L.L.P.

(57) ABSTRACT

A method of forming an integrated circuit device includes forming a gate stack covering a middle portion of a semiconductor fin, forming a gate spacer layer over the gate stack and the semiconductor fin, and patterning the gate spacer layer. The resulting spacers include a gate spacer on a sidewall of the gate stack, and a fin spacer on a sidewall of an end portion of the semiconductor fin. The fin spacer is then etched. When the etching is finished, a height of the fin spacer is smaller than about a half of the height of the semiconductor fin.

20 Claims, 12 Drawing Sheets

METHOD OF REDUCING THE HEIGHTS OF SOURCE-DRAIN SIDEWALL SPACERS OF FINFETS THROUGH ETCHING

This application claims the benefit of the following provisionally filed U.S. patent application: Application Ser. No. 61/780,647, filed Mar. 13, 2013, and entitled "Novel FinFET Structure with Improved High Current Sustainability," which application is hereby incorporated herein by reference.

BACKGROUND

Transistors are key components of modern integrated circuits. To meet the requirement of increasingly faster speed, the drive currents of transistors need to be increasingly greater. Since the drive currents of transistors are proportional to the gate widths of the transistors, transistors with greater widths are preferred.

The increase in the gate widths of the transistors, however, conflicts with the requirements of reducing the sizes of semiconductor devices. Fin field-effect transistors (FinFET) were thus developed. By forming fins that act as the channel region of the FinFET, the drive currents of the transistors are increased without the cost of occupying more chip area.

The FinFETs, however, also suffer from drawbacks. With the increasing down-scaling of FinFETs, the increasingly smaller sizes of the fins result in the increase of the resistances in the source/drain regions, and hence the degradation of device drive currents. The contact resistances between the contact plugs and source/drain silicide regions of the FinFETs are also increased due to small fin areas. Additionally, it is difficult to form contact plugs connected to source/drain silicide regions of the FinFETs. This is because the fins of the FinFETs have small areas, the landing areas for the corresponding contact plugs are thus small. The process window for landing contact plugs accurately on fins is also small, which means that there is little room for the process variations to occur without affecting the reliability of the resulting FinFETs.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 9B are cross-sectional views and perspective views of intermediate stages in the manufacturing of a Fin Field-Effect Transistor (FinFET) in accordance with some embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Fin Field-Effect Transistor (FinFET) and the method of forming the same are provided. The intermediate stages of manufacturing the FinFET are provided. The variations of the FinFET and the respective formation method are discussed. Throughout the various views and illustrative embodiments, like reference numbers are used to designate like elements.

Figure 1:
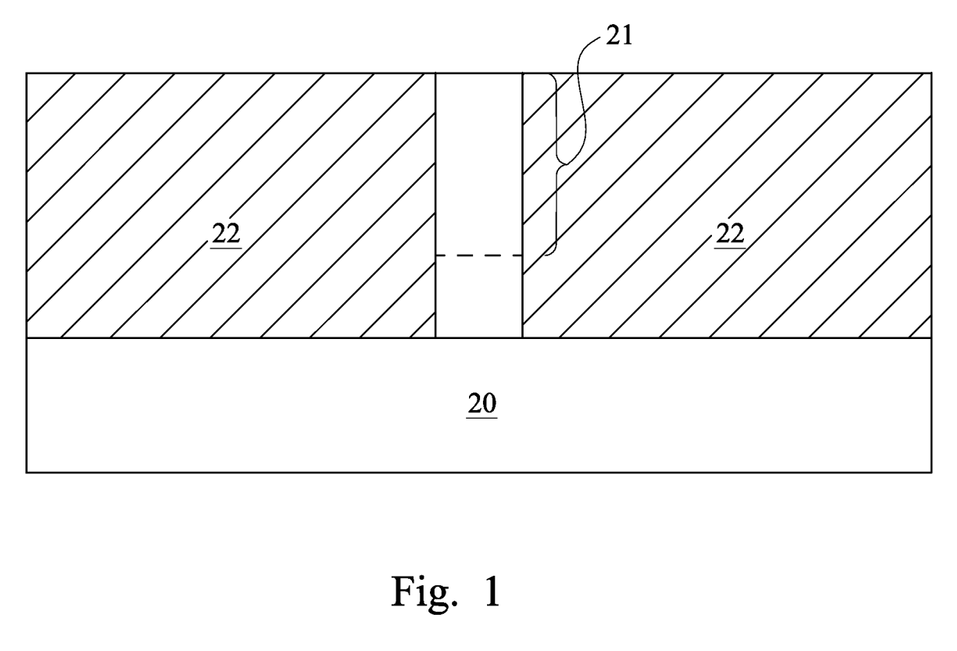

Referring to FIG. 1, semiconductor substrate 20 is provided. Semiconductor substrate 20 may be a bulk silicon substrate, a bulk silicon-germanium substrate, or the like. Insulation regions 22 are formed to extend into semiconductor substrate 20. In some embodiments, the formation of insulation regions 22 includes forming trenches in semiconductor substrate 20 by recessing semiconductor substrate 20, followed by filling the trenches with a dielectric material. Insulation regions 22 may include oxides that are formed using, for example, High-Density Plasma (HDP), Flowable Chemical Vapor Deposition (FCVD), or the like. In some exemplar embodiments, insulation regions 22 include silicon oxide ($SiO_2$), silicon nitride, or multi-layers thereof. Insulation regions 22 are alternatively referred to as Shallow Trench Isolation (STI) regions 22 hereinafter.

Figure 2:
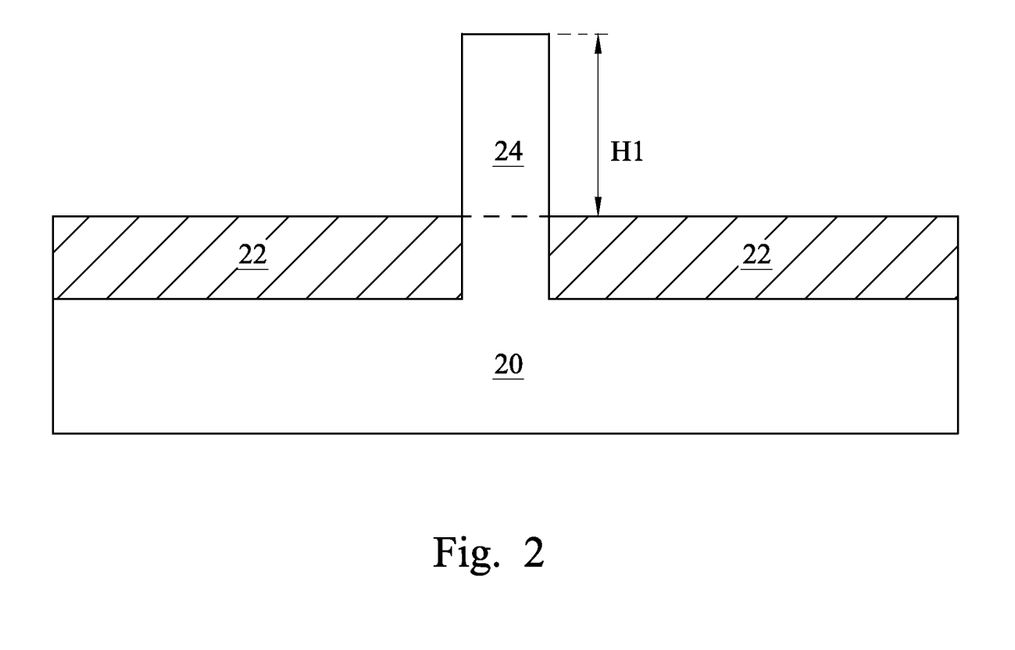

Referring to FIG. 2, STI regions 22 are recessed. As a result, a portion of the semiconductor substrate 20, which portion protrudes above the top surface of STI regions 22, forms semiconductor fin 24. The height H1 of semiconductor fin 24 is between about 100 Å and about 900 Å in some exemplary embodiments. One skilled in the art will realize, however, that the values recited through the description are merely examples, and will scale with the down-scaling of the integrated circuits.

In alternative embodiments, before the recessing of STI regions, 22, portion 21 of semiconductor substrate 20 (FIG. 1) is replaced with another semiconductor material that is different from the material of semiconductor substrate 20. In some exemplary embodiments, portion 21 of semiconductor substrate 20 is first removed by etching, so that a recess is formed. Next, an epitaxy is performed to regrow another semiconductor material in the resulting recess, followed by a Chemical Mechanical Polish (CMP). The regrown semiconductor material may comprise silicon germanium, a III-V compound semiconductor material, or the like. As a result, semiconductor fin 24 and semiconductor substrate 20 comprise different materials.

Figure 3:
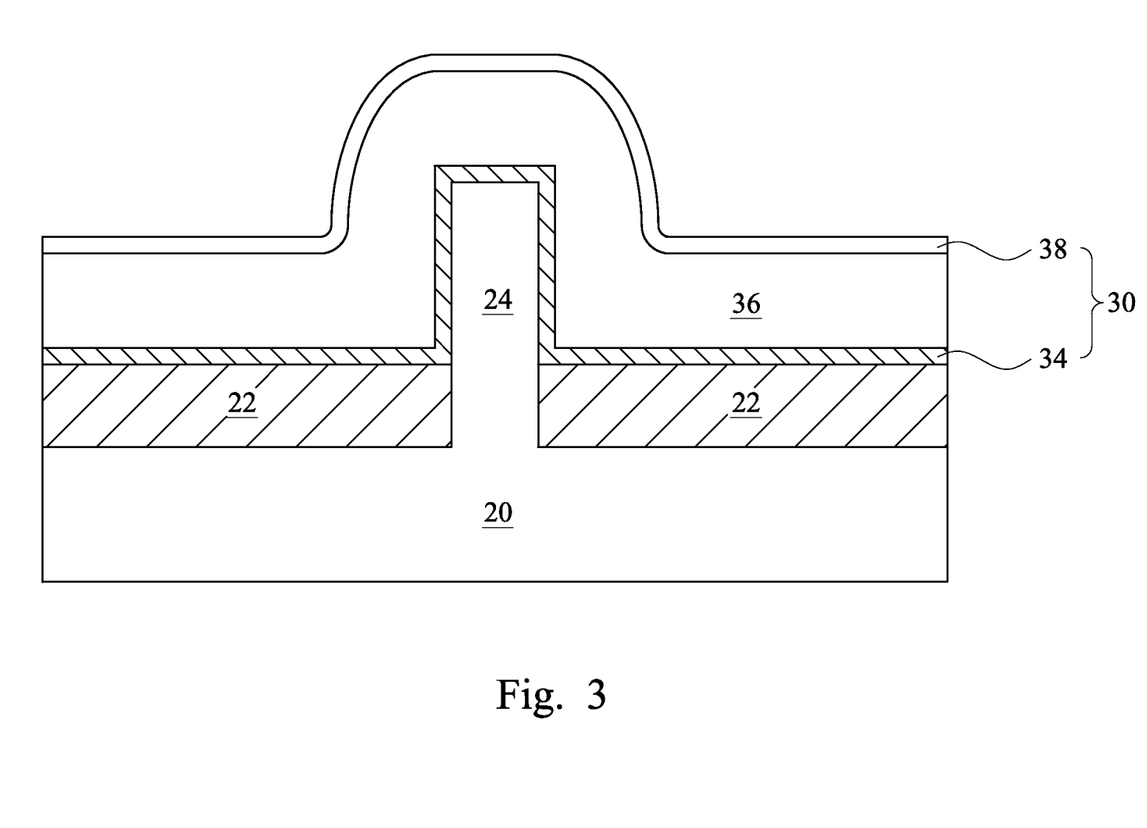

Referring to FIG. 3, gate stack 30, which includes gate dielectric layer 34, gate electrode layer 36, and mask layer 38, is formed. In some embodiments, gate dielectric layer 34 includes silicon oxide, which may be formed by a thermal oxidation of semiconductor fin 24. In other embodiments, gate dielectric layer 34 is formed by deposition, and may include dielectric materials having a dielectric constant (k value) equal to or greater than about 3.8. The usable materials for forming gate dielectric layer 34 include silicon oxide, silicon nitrides, oxynitrides, metal oxides such as $HfO_2$, $HfZrO_x$, $HfSiO_x$, $HfTiO_x$, $HfAlO_x$, and combinations and multi-layers thereof.

In some embodiments, gate electrode layer 36 is formed of polysilicon. In other embodiments, gate electrode layer 36 includes a material selected from metal nitrides (such as titanium nitride (TiN), tantalum nitride (TaN) and molybdenum nitride ($MoN_x$)), metal carbides (such as tantalum carbide (TaC) and hafnium carbide (HfC)), metal-nitride-carbides (such as TaCN), metal oxides (such as molybdenum oxide ($MoO_x$)), metal oxynitrides (such as molybdenum oxynitride ($MoO_xN_y$)), metal silicides (such as nickel silicide), and combinations thereof. Gate electrode layer 36 can also be a metal layer capped with a polysilicon layer.

Mask layer 38 may further be formed on top of gate electrode layer 36 in accordance with some embodiments. Mask layer 38 may include silicon nitride. Alternatively, other materials that are different from the subsequently formed fin spacers may be used.

Figure 4:
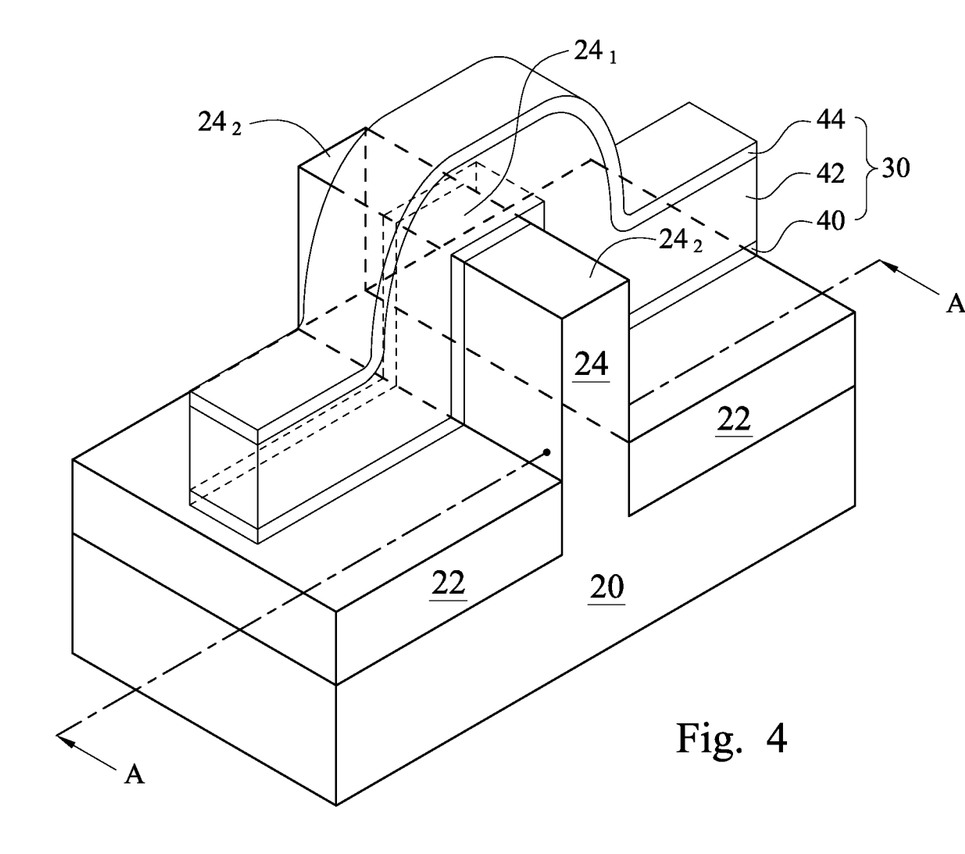

Gate stack 30 is then patterned to form gate dielectric 40, gate electrode 42, and mask 44. FIG. 4 illustrates a perspective view of the resulting structure. To form a FinFET device, middle portion $24_1$ of semiconductor fin 24 is covered by dielectric 40, gate electrode 42, and mask 44, while the end portions $24_2$ of fin 24 are exposed. End portions $24_2$ are on the opposite sides of middle portion $24_1$.

Figure 5:
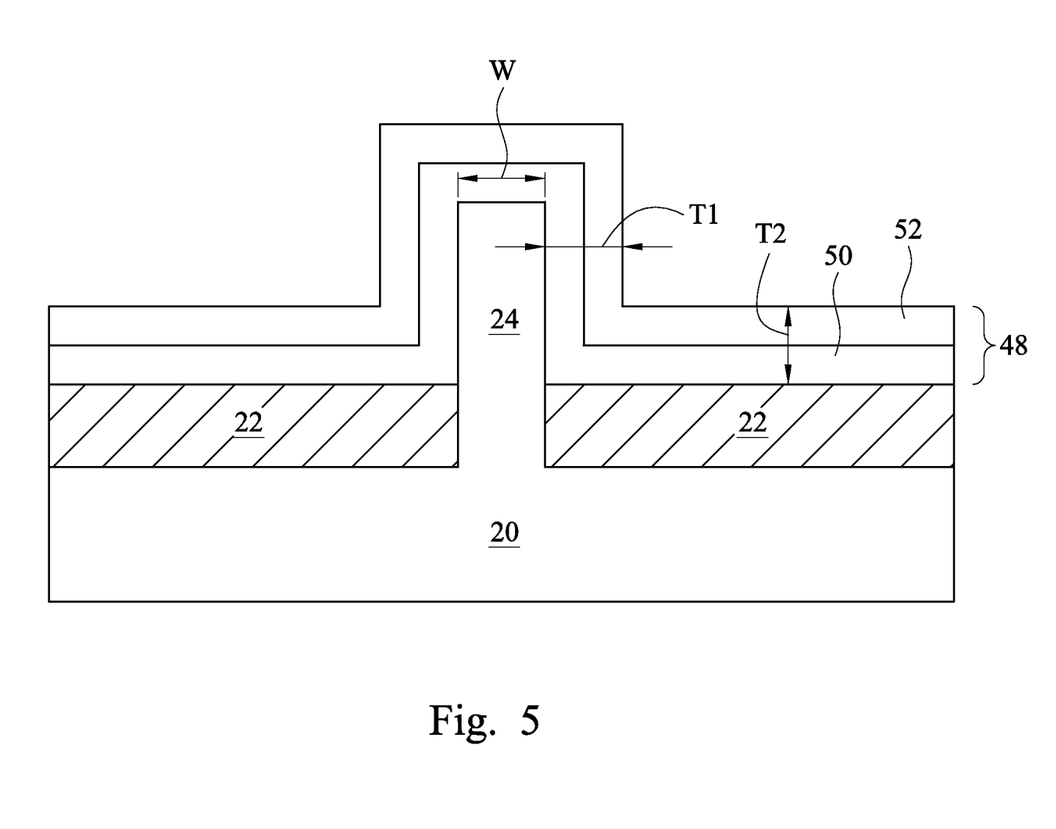

Next, as is illustrated in FIG. 5, spacer layer 48 is formed as a blanket layer. FIG. 5 illustrates a cross-sectional view taken along a plane, which is the same plane containing line A-A in FIG. 4. Accordingly, gate electrode 42 (FIG. 4) is not shown in the illustrated view. In some embodiments, spacer layer 48 includes silicon oxide layer 50, and silicon nitride layer 52 over silicon oxide layer 50. In alternative embodiments, spacer layer 48 may be formed of other dielectric materials and/or having other structures. For example, spacer layer 48 may be a single layer, which is a silicon oxide layer, a silicon nitride layer, or the like. Spacer layer 48 may be formed as a substantially conformal layer, and hence thickness T1 of the vertical portions of spacer layer 48 on the sidewalls of semiconductor fin 24 and gate stack 30 is close to thickness T2 of the horizontal portion of spacer layer 48. For example, thickness T1 and T2 may have a difference smaller than about 20 percent of thickness T2.

Figure 6A:
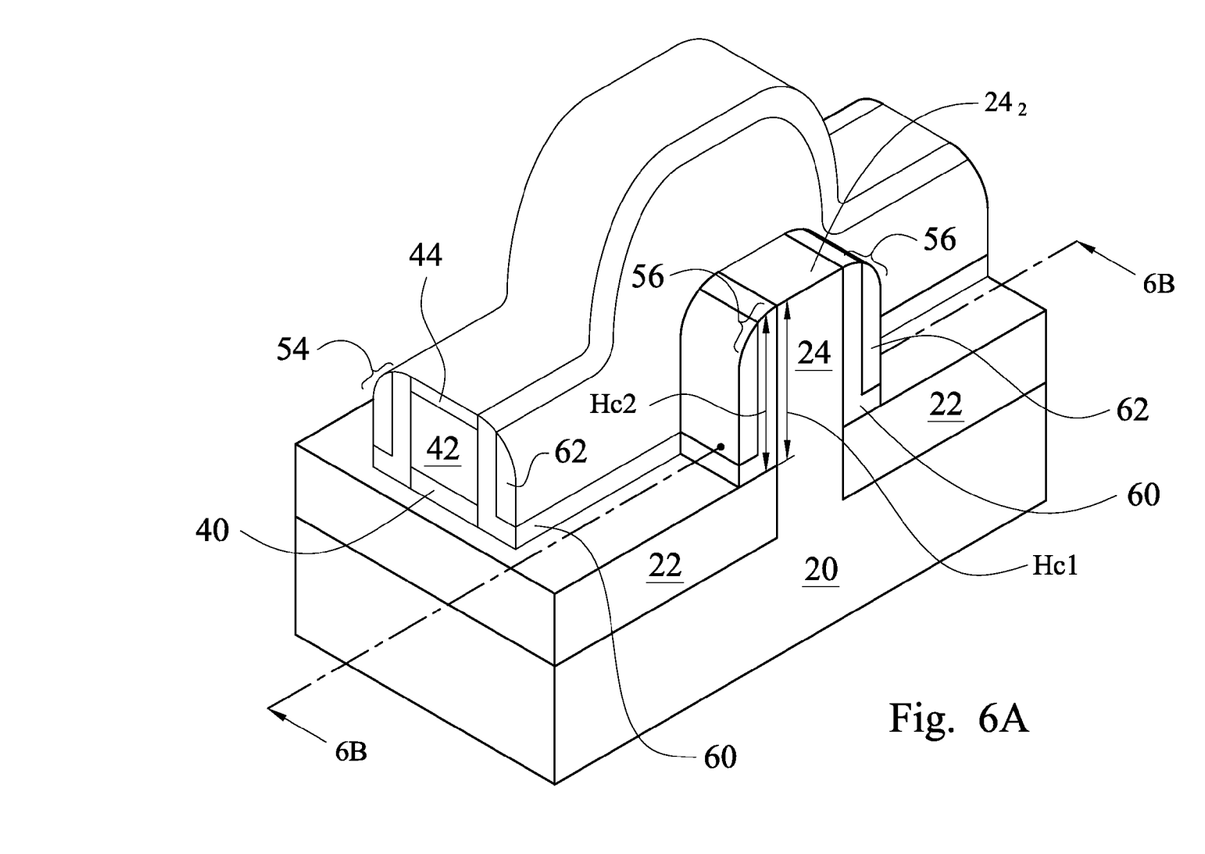
Figure 6B:
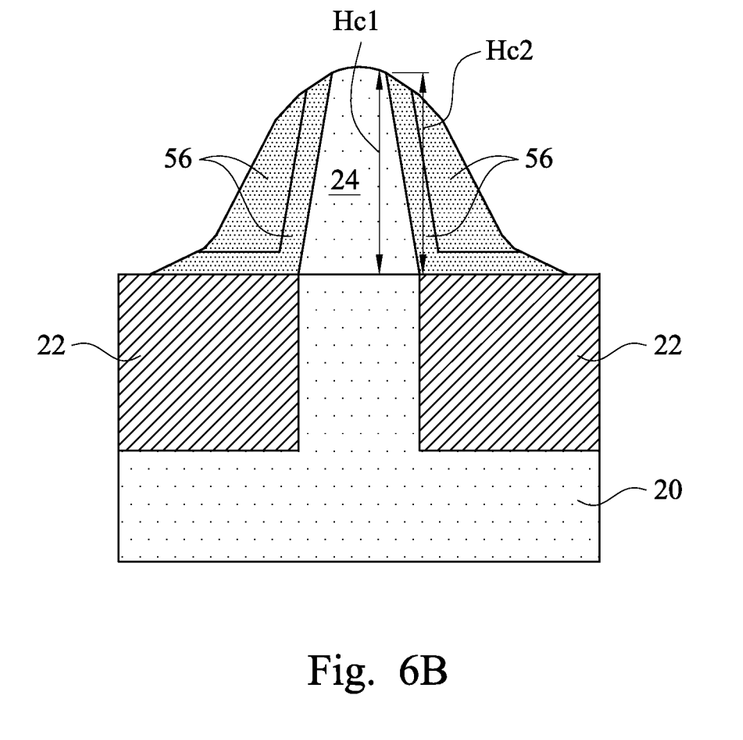

Next, spacer layer 48 is patterned, forming gate spacers 54 and fin spacers 56, as shown in FIGS. 6A and 6B. FIGS. 6A and 6B illustrate a perspective view and a cross-sectional view, respectively, wherein the cross-sectional view in FIG. 6B is obtained from the vertical plane containing line 6B-6B in FIG. 6A. In some embodiments in which spacer layer 48 (FIG. 5) includes silicon oxide layer 50 and silicon nitride layer 52, the patterning of the silicon nitride layer 52 (refer to FIG. 6) includes a dry etching using $CH_2F_2$ as an etchant, and the patterning of silicon oxide layer 50 includes a dry etching using $CF_4$ as an etchant, although other applicable etchants may be used. The patterning includes an anisotropic effect, so that the horizontal portions of spacer layer 48 are removed, while the vertical portions on the sidewalls of gate stack 30 remain to form gate spacers 54, respectively. As a side-effect, the vertical portions on the sidewalls of semiconductor fin 24 remain to form fin spacers 56. Fin spacers 56 and gate spacers 54 may include oxide portions 60 and nitride portions 62, which are the remaining portions of silicon oxide layer 50 (FIG. 5) and silicon nitride layer 52, respectively.

In some processes, after the horizontal portions of spacer layer 48 are removed, the patterning of spacer layer 48 is concluded. As a result, the top edge of semiconductor fin 24 is level with the top end of the resulting fin spacers 56. Alternatively stated, in the respective FinFETs, height Hc1 of semiconductor fin 24 is equal to height Hc2 of fin spacers 56. In some embodiments of the present disclosure, after the structure as shown in FIGS. 6A and 6B are formed, the patterning of spacer layer 48 is continued, so that fin spacers 56 are further thinned, and their heights are further reduced. In the meantime, the height of gate spacers 54 is also reduced. However, since gate spacers 54 is much higher than fin spacers 56, the reduction in the height of gate spacers 54, percentage wise, is not as significant as the reduction in the height fin spacers 56. In some embodiments, the thinning of fin spacers 56 includes an etch step. The etch step may be performed using the same or similar process conditions and etchant gases as the step shown in FIGS. 6A and 6B, although different process conditions may be used. For example, the continued etching may be an anisotropic etching. To prevent gate spacers 54 from being over-etched, the continued patterning is stopped when fin spacers 56 still have some portions remaining.

Figure 7A:
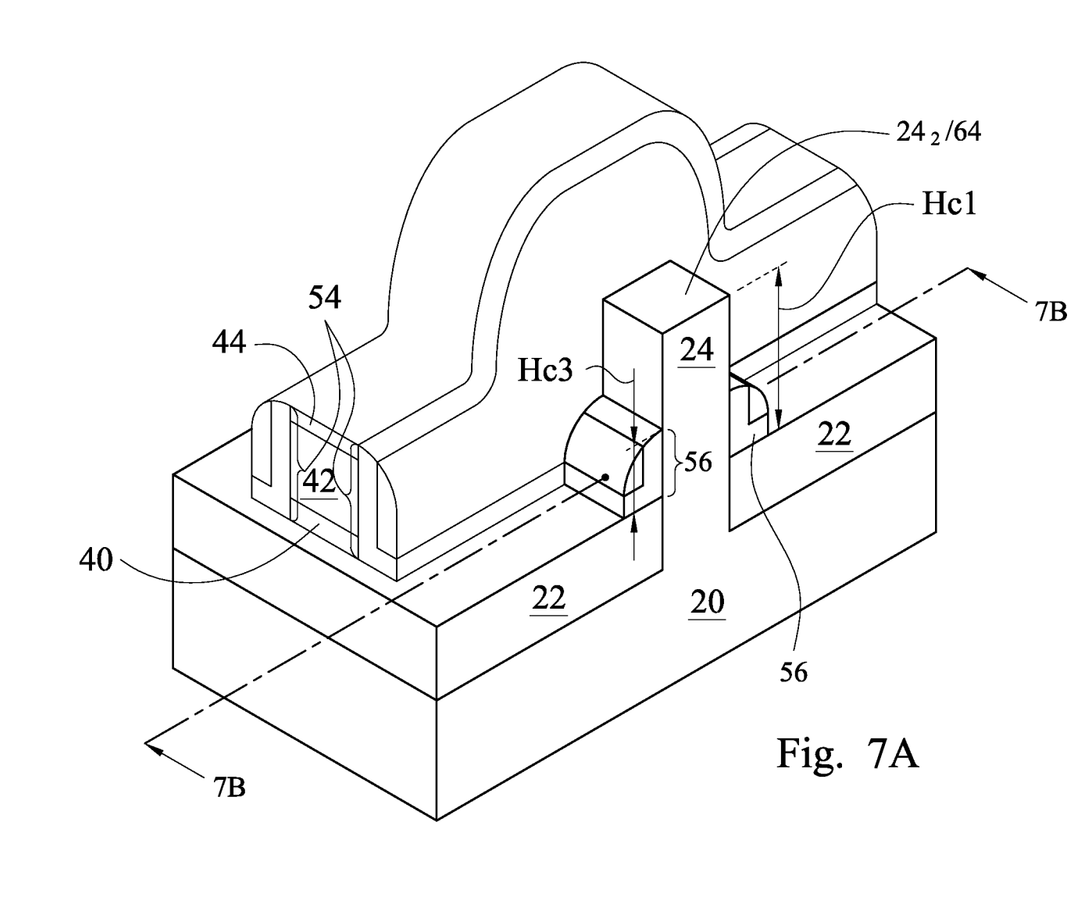
Figure 7B:
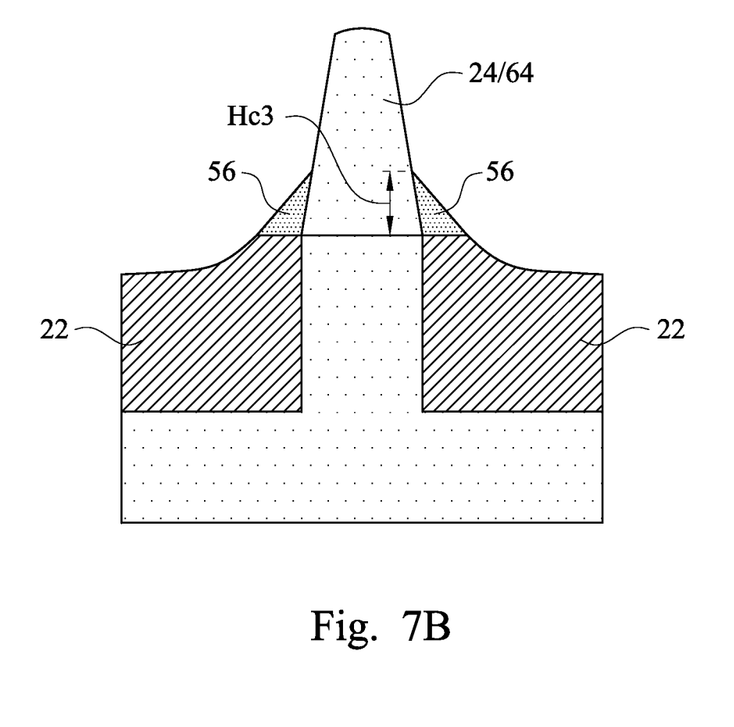

FIG. 7A illustrates a perspective view of the resulting structure after the thinning of fin spacers 56 is finished. FIG. 7B illustrates a cross-sectional view obtained from a vertical plane crossing line 7B-7B in FIG. 7A. As a result of the thinning, the height of fin spacers 56 is reduced to Hc3. In some embodiments, height Hc1 of semiconductor fin 24 is between about two times and about 10 times height Hc3 of fin spacers 56. Furthermore, the difference (Hc1-Hc3) may be greater than about 10 nm in some embodiments.

In the embodiments wherein spacer layer 48 (FIG. 5) comprises silicon oxide layer 50 and silicon nitride layer 52, as shown in FIGS. 5, 6A, and 6B, and further depending on the process conditions adopted for etching silicon oxide layer 50 and silicon nitride layer 52, the remaining fin spacers 56 may have different structures. In some embodiments, fin spacers 56 include remaining portions of silicon oxide layer 50, but do not include the remaining portions of silicon nitride layer 52. In alternative embodiments, fin spacers 56 include both the remaining portions of silicon oxide layer 50 and the remaining portions of silicon nitride layer 52. Gate spacers 54, on the other hand, include both remaining portions of silicon oxide layer 50 and the remaining portions of silicon nitride layer 52.

Since gate spacer layer 48 (FIG. 5) and STI regions 22 are formed in different process steps, using different methods, and/or comprising different materials, fin spacers 56 and STI regions 22 may have distinguishable interfaces that may be distinguishable, for example, using an electron microscope. For example, even if STI regions 22 and oxide layer 50 are both formed of silicon oxide, the density of oxide layer 50 may be higher than that of STI regions 22, and hence the interfaces between fin spacers 56 and STI regions 22 can be distinguished.

Gate spacers 54 and fin spacers 56 are formed by patterning the same gate spacer layer 48 (FIG. 5). Accordingly, gate spacers 54 and fin spacers 56 are continuously connected to each other, with no distinguishable interfaces separating them from each other. Furthermore, fin spacers 56 have outer sidewalls whose heights are gradually reduced, and the outer portions of fin spacers 56 have heights smaller than the respective inner portions.

After the formation of gate spacers 54, an implantation step may be performed to implant the exposed end portions $24_2$ of semiconductor fin 24 to form source and drain regions 64. Depending on the desirable type of the resulting FinFET, a p-type impurity is implanted to form a p-type FinFET, or an n-type impurity is implanted to form an n-type FinFET.

Figure 8:
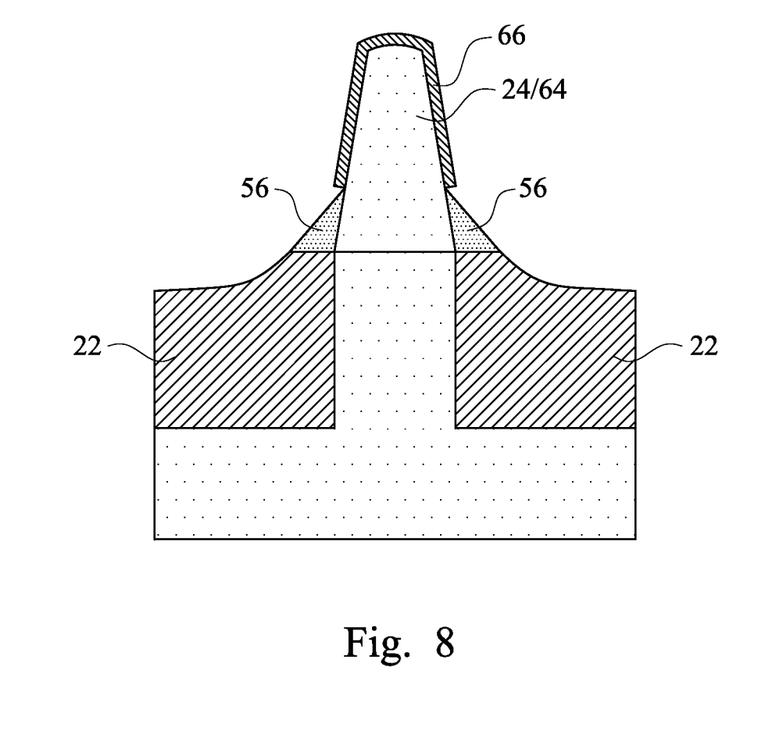

FIG. 8 illustrates the silicidation process to silicide the surfaces of semiconductor fin 24 and to form silicide region 66. FIG. 8 illustrates a cross-sectional view taken along a plane, which is the same plane containing line 7B-7B in FIG. 7A. In some exemplary silicidation process, a thin layer of metal (not shown), such as nickel, platinum, palladium, vanadium, titanium, cobalt, tantalum, ytterbium, zirconium, or combinations thereof, is deposited. The substrate is then heated, which causes silicon and germanium to react with the metal where contacted. After the reaction, metal-silicide layer 66 is formed on the top surface and the sidewalls of source/drain regions 64, which are also portions of semiconductor fin 24. The un-reacted metal is selectively removed through the use of an etchant that attacks metal but does not attack the silicide. The resulting silicide layer 66 include a top surface portion on the top surface of semiconductor fin 24, and sidewall portions on the sidewalls of semiconductor fin 24. The sidewall portions of silicide layer 66 have bottom ends self-aligned to the top ends of fin spacers 56. The respective silicidation is hence a Self-Aligned Silicidation (Salicide).

Figure 9A:
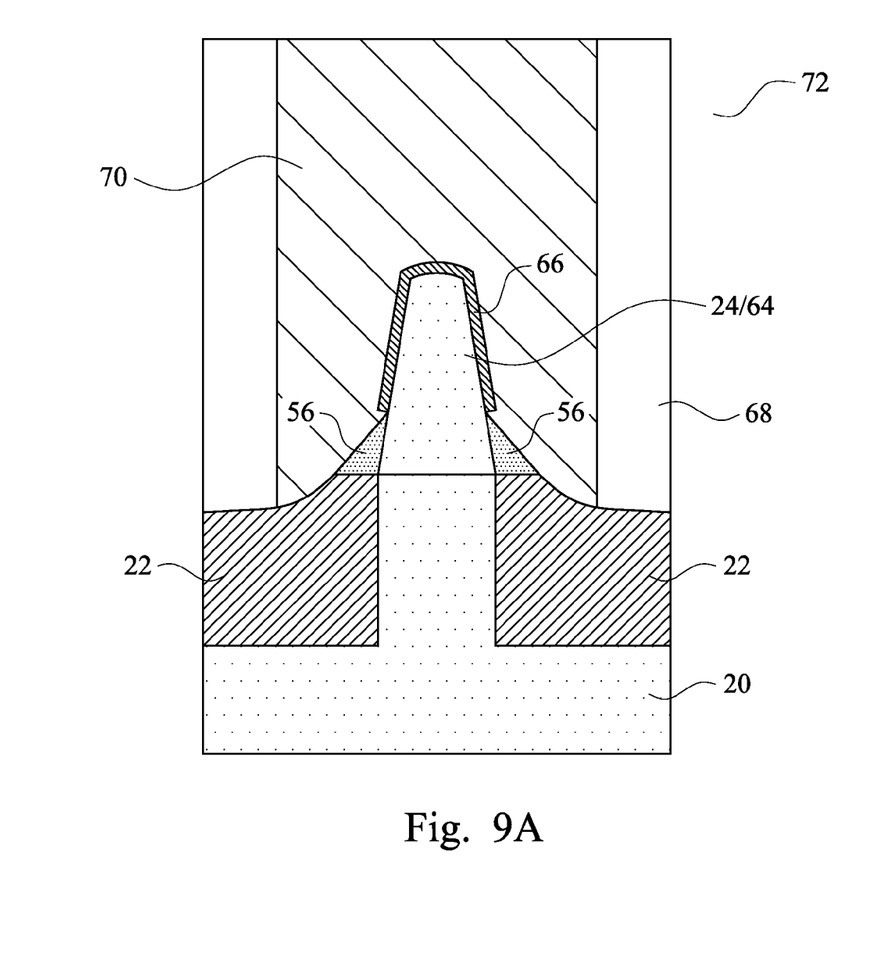
Figure 9B:
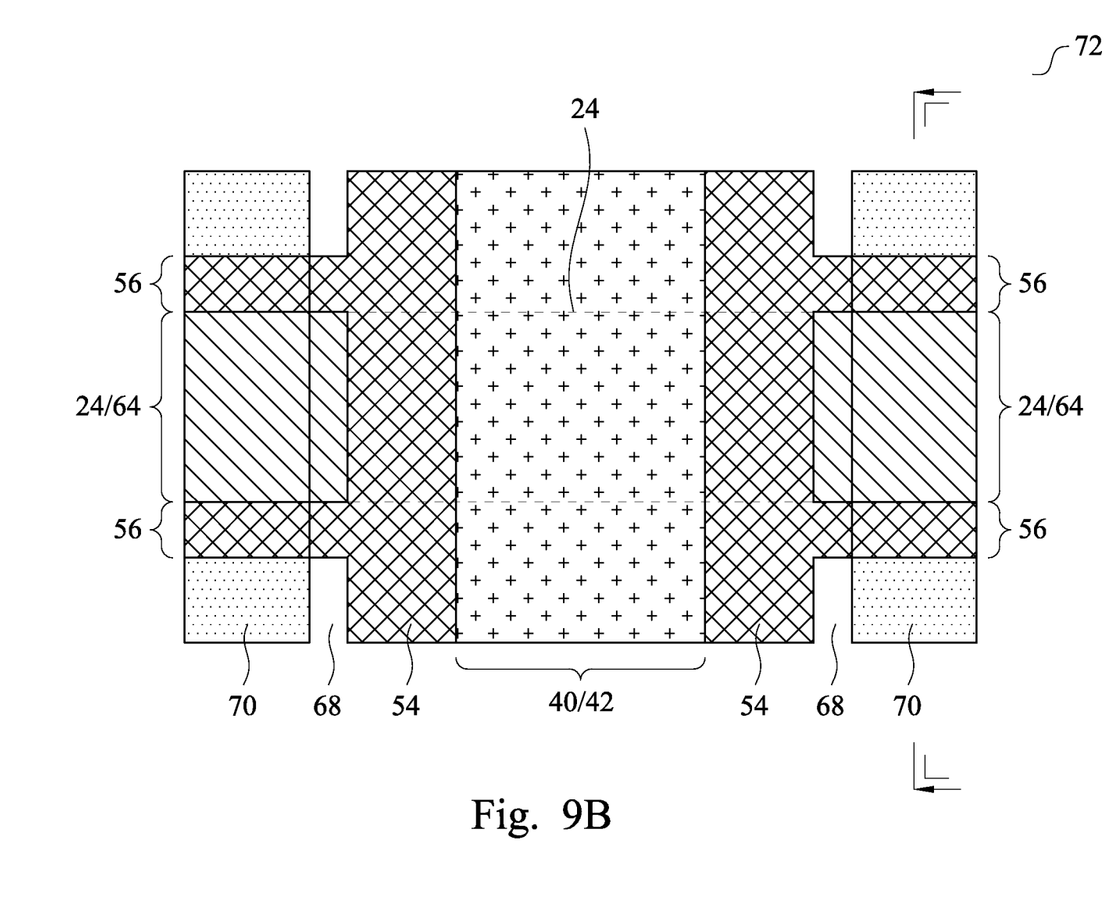

FIG. 9A illustrates the formation of Inter-Layer Dielectric (ILD) 68 and contact plug 70 in ILD 68. In some embodiments, ILD 68 is first formed to cover the structure shown in FIG. 8. ILD 68 may include silicon oxide, silicon carbide, a low-k dielectric material, Phospho-Silicate Glass (PSG), Boro-Silicate Glass (BSG), Boron-Doped Phospho-Silicate Glass (BPSG), Tetra Ethyl Ortho Silicate (TEOS) oxide, or the like. A contact opening (occupied by contact plug 70) is then formed in ILD 68 to expose the top surface portion and the sidewall portions of silicide layer 66. A metal is then filled into the contact opening, followed by a Chemical Mechanical Polish (CMP) to remove excess metal and to level the top surface of contact plug 70. FIG. 9B illustrates a top view of the resulting FinFET, which illustrates the positions of gate dielectric 40, gate electrode 42, gate spacers 54, fin spacers 56, and contact plug 70. FIG. 9A is obtained from the plane containing line 9A-9A in FIG. 9B. Mask layer 44 (FIG. 5), if any, is removed, and a gate contact plug (not shown) is formed to electrically couple to gate electrode 42. FinFET 72 is thus formed.

As shown in FIG. 9A, contact plug 70 is electrically coupled to the sidewall portions and the top surface portion of silicide layer 66. Hence, in the operation of the resulting FinFET 72, current may flow through both the sidewall portions and the top surface portion of silicide layer 66 and semiconductor fin 24. The current crowding is then reduced. As a comparison, if fin spacers 56 have the height as shown in FIG. 6B, the source/drain silicide will be formed on the top surface, but not on the sidewalls, of fin 24, and the current crowding may occur. Simulation results indicated that by using the embodiments of the present disclosure, the It2 current (the maximum current that a fin can withstand under ESD stress) flowing through each fin of the FinFET may increase by about 25 percent.

In accordance with some embodiments, an integrated circuit device includes a semiconductor substrate, insulation regions extending into the semiconductor substrate, and a semiconductor fin protruding above the insulation regions. The insulation regions include a first portion and a second portion, with the first portion and the second portion on opposite sides of the semiconductor fin. The semiconductor fin has a first height. A gate stack is overlying a middle portion of the semiconductor fin. A fin spacer is on a sidewall of an end portion of the semiconductor fin. The fin spacer has a second height, wherein the first height is greater than about two times the second height.

In accordance with other embodiments, an integrated circuit device includes a semiconductor substrate, insulation regions extending into the semiconductor substrate, and a FinFET. The FinFET includes a semiconductor fin over the insulation regions. The insulation regions include a first portion and a second portion, with the first portion and the second portion on opposite sides of the semiconductor fin. The semiconductor fin has a first height. The FinFET further includes a gate stack over a middle portion of the semiconductor fin, a source/drain region at an end of the semiconductor fin, and a fin spacer on a sidewall of the source/drain region. The fin spacer has a second height, wherein the first height is greater than about two times the second height. The FinFET further includes a source/drain silicide layer having a sidewall portion on a sidewall of the source/drain region, wherein a bottom end of the source/drain silicide layer contacts a top end of the first fin spacer.

In accordance with yet other embodiments, a method includes forming a gate stack covering a middle portion of a semiconductor fin, forming a gate spacer layer over the gate stack the semiconductor fin, and patterning the gate spacer layer to form a gate spacer on a sidewall of the gate stack, and a fin spacer on a sidewall of an end portion of the semiconductor fin. The fin spacer is etched. When the step of etching the fin spacer is finished, a first height of the fin spacer is smaller than about a half of a second height of the semiconductor fin.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a gate stack covering a middle portion of a semiconductor fin;
    forming a gate spacer layer over the gate stack and the semiconductor fin;
    patterning the gate spacer layer to form:
        a gate spacer on a sidewall of the gate stack; and
        a fin spacer on a sidewall of an end portion of the semiconductor fin; and
    etching the fin spacer, wherein when the step of etching the fin spacer is finished, a first height of the fin spacer is smaller than about a half of a second height of the semiconductor fin.

2. The method of claim 1, wherein when the step of etching the fin spacer is finished, a ratio of the second height to the first height is between about 2 and about 10.

3. The method of claim 1, wherein the step of forming the gate spacer layer comprises:
    depositing a silicon oxide layer; and
    depositing a silicon nitride layer over the silicon oxide layer.

4. The method of claim 3, wherein when the step of etching the fin spacer is finished, the gate spacer comprises a first remaining portion of the silicon oxide layer, and a first remaining portion of the silicon nitride layer, and wherein the fin spacer comprises a second remaining portion of the silicon oxide layer, and a second remaining portion of the silicon nitride layer.

5. The method of claim 3, wherein when the step of etching the fin spacer is finished, the gate spacer comprises a first remaining portion of the silicon oxide layer, and a first remaining portion of the silicon nitride layer, and wherein the fin spacer comprises a second remaining portion of the silicon oxide layer, and is free from any remaining portion of the silicon nitride layer.

6. The method of claim 1 further comprising:
    implanting an end portion of the semiconductor fin to form a source/drain region, wherein the fin spacer contacts a sidewall of the source/drain region;
    after the etching the fin spacer, performing a salicide step to silicide a top surface and sidewall surfaces of the end portion of the semiconductor fin, wherein a silicide layer is formed by the salicide step, and wherein the silicide layer comprises a top surface portion and a sidewall portion; and forming a contact plug to contact the top surface portion and the sidewall portion of the silicide layer.

7. A method comprising:

forming a gate stack on a middle portion of a semiconductor fin;

forming a gate spacer layer over the gate stack and the semiconductor fin;

performing an anisotropic etching to remove horizontal portions of the gate spacer layer, wherein remaining portions of the gate spacer layer comprise:

a gate spacer left on a sidewall of the gate stack; and a fin spacer on a sidewall of an end portion of the semiconductor fin; and performing an additional etching to thin the gate spacer and the fin spacer, wherein when the additional etching is finished, a first height of the fin spacer is smaller than about a half of a second height of the semiconductor fin.

8. The method of claim 7, wherein after the additional etching, both the gate spacer and the fin spacer have portions remaining.

9. The method of claim 7, wherein the fin spacer comprises a first sub layer and a second sub layer over the first sub layer, with the first sub layer and the second sub layer formed of different materials, and wherein after the additional etching, the second sub layer is fully removed, and the first sub layer remains.

10. The method of claim 9, wherein after the additional etching, the gate spacer comprises:

a third sub layer formed of a same material as the first sub layer; and a fourth sub layer over the third sub layer, wherein the fourth sub layer is formed of a same material as the second sub layer.

11. The method of claim 9, wherein the first sub layer comprises silicon oxide, and the second sub layer comprises silicon nitride.

12. The method of claim 7, wherein when the additional etching is finished, a ratio of a height of the gate spacer to a height of the fin spacer is between about 2 and about 10.

13. The method of claim 7 further comprising:

implanting the end portion of the semiconductor fin to form a source/drain region, wherein the fin spacer contacts a sidewall of the source/drain region;

after the additional etching, performing a salicide step to form a silicide layer; and forming a contact plug to contact the silicide layer.

14. A method comprising:

recessing shallow trench isolation regions, with a semiconductor region between the recessed shallow trench isolation regions forming a semiconductor fin;

forming a gate stack on a first portion of the semiconductor fin, and leaving a second portion of the semiconductor fin uncovered by the gate stack;

depositing a gate spacer layer comprising:

blanket depositing a first dielectric layer on the gate stack and the second portion of the semiconductor fin; and depositing a second dielectric layer over the first dielectric layer, wherein the first dielectric layer and the second dielectric layer are formed of different materials;

performing a first etch to remove horizontal portions of the gate spacer layer, wherein remaining portions of the gate spacer layer comprise:

a gate spacer left on a sidewall of the gate stack; and a fin spacer on a sidewall of the second portion of the semiconductor fin, wherein each of the gate spacer and the fin spacer comprises a portion of the first dielectric layer and a portion of the second dielectric layer; and performing a second etch to remove an entirety of the portion of the second dielectric layer in the fin spacer.

15. The method of claim 14, wherein after the second etch, the portion of the second dielectric layer in the gate spacer has a remaining portion.

16. The method of claim 14, wherein the first etch and the second etch are performed using same process conditions.

17. The method of claim 14, wherein the first etch and the second etch are performed using different process conditions.

18. The method of claim 17, wherein the first etch is anisotropic, and the second etch is isotropic.

19. The method of claim 14, wherein the first dielectric layer comprises silicon oxide, and the second dielectric layer comprises silicon nitride.

20. The method of claim 14 further comprising:

implanting the second portion of the semiconductor fin to form a source/drain region, wherein the fin spacer contacts a sidewall of the source/drain region;

after the second etch, performing a salicide step to form a silicide layer; and forming a contact plug to contact the silicide layer.

* * * * *